(12) United States Patent
Rai et al.

(10) Patent No.: US 8,216,341 B2
(45) Date of Patent: Jul. 10, 2012

(54) SYSTEM AND METHOD FOR LOCATING SPARKS IN ELECTROSTATIC PRECIPITATORS

(75) Inventors: Sudhanshu Rai, Bangalore (IN); Vinay Bhaskar Jammu, Bangalore (IN); Rahul Srinivas Prabhu, Bangalore (IN)

(73) Assignee: Babcock & Wilcox Power Generation Group, Inc.

( * ) Notice: Subject to any disclaimer, the term of this patent is extended or adjusted under 35 U.S.C. 154(b) by 799 days.

(21) Appl. No.: 12/269,104

(22) Filed: Nov. 12, 2008

(65) Prior Publication Data
US 2010/0116127 A1    May 13, 2010

(51) Int. Cl.
*B03C 3/68* (2006.01)
(52) U.S. Cl. .................... 95/5; 96/20; 323/903
(58) Field of Classification Search ............. 95/2, 5; 96/18, 20; 323/903
See application file for complete search history.

(56) References Cited

U.S. PATENT DOCUMENTS

| | | | | |
|---|---|---|---|---|
| 4,290,003 A | * | 9/1981 | Lanese | 323/241 |
| 6,115,230 A | | 9/2000 | Voigts et al. | |
| 7,452,403 B2 | * | 11/2008 | Younsi et al. | 95/5 |
| 7,594,958 B2 | * | 9/2009 | Krichtafovitch et al. | 96/18 |
| 2005/0210902 A1 | * | 9/2005 | Parker et al. | 62/230 |
| 2006/0055343 A1 | * | 3/2006 | Krichtafovitch et al. | 315/291 |
| 2007/0151446 A1 | * | 7/2007 | Younsi et al. | 95/2 |
| 2010/0147150 A1 | * | 6/2010 | Parker et al. | 96/20 |

FOREIGN PATENT DOCUMENTS

| | | | |
|---|---|---|---|
| EP | 0145221 B1 | 8/1988 | |
| JP | 61114759 A | 6/1986 | |
| JP | 6-114286 A | * 4/1994 | 96/20 |
| JP | 2000117146 A | 4/2000 | |
| JP | 2001017886 A | 1/2001 | |

OTHER PUBLICATIONS

Q. Kerns, M. Popovic and C. Kerns; "Spark Location in RF Cavities"; IEEE1996; pp. 1838-1840.
Sidhu et al.; "A New Technique for Detection and Location of Arcing Faults in Power System Apparatus"; 0-7803-4314-X/98/IEEE1998; pp. 185-188.
Sidhu et al.; "On-Line Detection and Location of Low-Level Arcing in Dry-Type Transformers"; IEEE Transactions on Power Delivery, vol. 16, No. 1, Jan. 2002; pp. 135-141.

* cited by examiner

*Primary Examiner* — Richard L Chiesa
(74) *Attorney, Agent, or Firm* — Eric Marich (57) ABSTRACT

A system includes an electrostatic precipitator, an electromagnetic sensor and a processor to locate spark locations. The electromagnetic sensor is used at various locations of the electrostatic precipitator to obtain data and process the same for locating sparks in electrostatic precipitators.

19 Claims, 7 Drawing Sheets

SYSTEM AND METHOD FOR LOCATING SPARKS IN ELECTROSTATIC PRECIPITATORS

BACKGROUND OF THE INVENTION

The present invention relates generally to systems and methods for locating sparks in electrostatic precipitators.

An electrostatic precipitator (ESP) removes particles from a flowing gas (such as air) using the force of an induced electrostatic charge. ESPs act as filtration devices that minimally impede the flow of gases and can easily remove fine particulate matter such as dust and smoke from the air stream. A typical ESP includes a row of cathodes disposed between large flat metal collection plates. The cathodes and the plates are typically applied with a high voltage of several thousand volts. The gas to be purified of fine particulate matter is flowed through the ESP near the cathodes. The high voltage ionizes the air around the cathodes. The gas stream flows through the spaces between the cathodes and then dust or particles (fine particulate) gets collected on the collection plates.

The fine particulate collection efficiency within a respective ESP is dependent on the field intensity that is proportional to the voltage applied between the cathodes. Thus, in order to efficiently collect fine particulate or dust, it is of utmost importance to maintain the applied voltage as high as possible. However, the voltage is limited by the phenomena of sparking that occurs more and more frequently as the electric field strength, temperature of the gas, humidity, or number of fine particulate or dust particles in the gas is increased. The composition of the gas and the resistivity of the fine particulate also have a major affect on the sparking voltage. Each time a spark occurs, the voltage across the ESP falls sharply and then, after the spark is extinguished, recovers to its original value. If the applied voltage is increased, the sparking rate is increased. ESP sparks in the cathodes, thus, result in lower operating voltage and hence reduced performance. Thus, it is useful not only to detect the existence or initiation of the sparks in an ESP but also to determine the location of the sparks.

Conventional methods of locating the sparks include manual viewing of sparks through glass, which viewing can be a challenge due to the large amount of dust that is typically present in ESPs. Such a process is time consuming and can only be done offline.

Thus, there is a need for a method and a system that detects and locates sparks within an ESP during operation to avoid excessive wear and tear, and improve the overall operability of an ESP.

BRIEF DESCRIPTION

In accordance with one exemplary embodiment of the present invention a system for locating sparks in an electrostatic precipitator is disclosed. The system comprises at least one electromagnetic sensor, an electrostatic precipitator and a processing device for determining a location of a spark within an electrostatic precipitator (ESP) using data received from the at least one electromagnetic sensor.

In accordance with another exemplary embodiment of the present invention a system for locating sparks in an electrostatic precipitator is disclosed wherein the system comprises at least one loop antenna, an electrostatic precipitator and a processing device for determining a location of a spark within an electrostatic precipitator (ESP) using data received from the at least one loop antenna.

In accordance with another exemplary embodiment of the present invention a method for locating sparks in an electrostatic precipitator is disclosed. The method comprises obtaining electromagnetic field data associated with the ESP and using the electromagnetic field data to determine a location of the spark.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As discussed in detail below, embodiments of the present invention typically include at least one electromagnetic sensor, an electrostatic precipitator and a processor. While the design of an electrostatic precipitator varies as per its application and operation in various industries, a typical electrostatic precipitator is comprised of a row of cathodes disposed between a set of collection plates. A high voltage of several thousand volts is applied, that ionizes air around the cathodes. Air or gas to be purified of dust particles or fine particulate is passed in the ESP adjacent the cathodes. The fine particulate or dust particles in the air or gas become negatively charged while passing adjacent the negatively charged cathodes and are attracted to the positively charged collection plates. Thus, dust particles or fine particulate build up on the collection plates and form a layer. The process of collection of fine particulate or dust particles continues at the expected pace as long as the high voltage is maintained and other factors do not affect the electrostatic precipitator. The various factors that affect the electrostatic precipitator and may lead to spark generation include, for example, resistivity of fine particles, an increase in field intensity, or an increase in the number of particles.

Sparks result in high current and hence, as per Ampere's law, a high electro magnetic field is generated. While some electromagnetic waves associated with the electromagnetic field are transmitted, some are absorbed and some are reflected by the material present in the electrostatic precipitator, a sufficient part of the electro magnetic field reaches a sensor located adjacent the electrostatic precipitator. The electromagnetic sensors, for example loop antennas or other electromagnetic sensors, are used to detect an electromagnetic field developed in the electrostatic precipitator as a result of a spark in the cathodes. In one aspect of the invention one or more electromagnetic sensors are moved from one point of the electrostatic precipitator to another point to detect electromagnetic field intensity at various locations of the ESP. In another aspect of the invention multiple electromagnetic sensors are mounted adjacent to the ESP to detect electromagnetic field intensity and spark occurrences and locations. The electromagnetic sensors are typically optimally positioned adjacent to the electrostatic precipitator to maximize the absorption of the electromagnetic field and enhance the efficiency in detection of the sparks.

Figure 1:
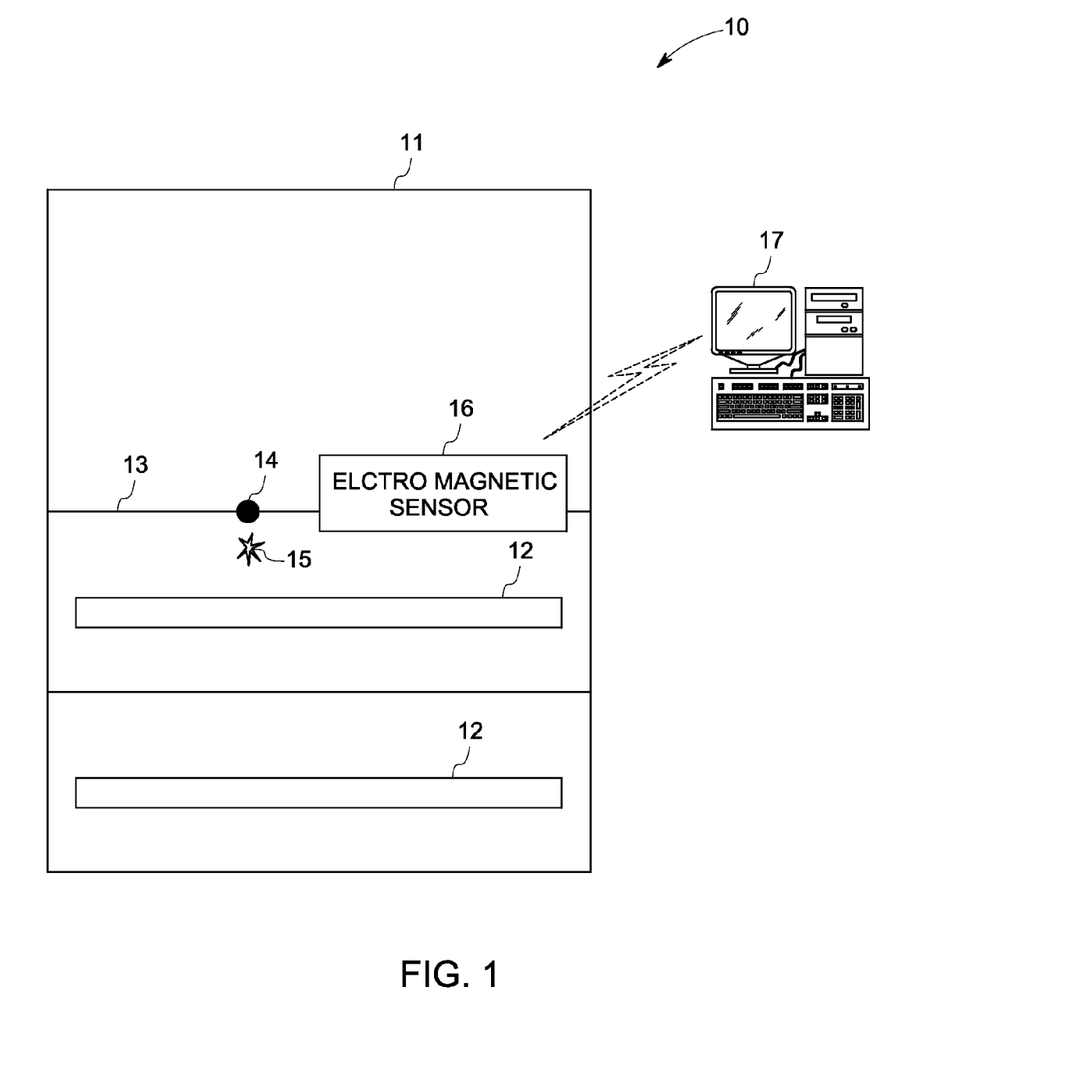
FIG. 1 is a diagrammatical view of one embodiment of an electrostatic precipitator.

A system 10 comprising an electrostatic precipitator 11, an electromagnetic sensor 16 and a processor 17 is shown in FIG. 1. In the illustrated embodiment of the system 10 the electrostatic precipitator 11 includes a cathode 14 mounted on a supply wire 13 and a plurality of collection plates 12. Upon the occurrence of a spark 15 in the cathode 14, electromagnetic sensor 16 senses the electromagnetic field generated at various locations within the electrostatic precipitator 11 and generates corresponding signals representative of the sensed electromagnetic field. The signals are sent to a processor 17 that is configured to process the signals from various locations of electrostatic precipitator 11 to generate an electromagnetic field profile. In one embodiment, the processor 17 segregates a peak electromagnetic profile from the generated electromagnetic field profile to detect and locate the sparks.

In one embodiment of the present invention, the electromagnetic sensors 16 are mounted on the top or roof of a respective electrostatic precipitator 11. Alternatively, the electromagnetic sensors 16 are handheld portable sensors, as discussed in greater detail below. The number and type of electromagnetic sensors 16 depends upon the type and size of the respective electrostatic precipitator 11.

In some embodiments, the electromagnetic field data received from sensors 16 is raw and has a certain level of noise. Accordingly, it is often beneficial to remove noise from the electromagnetic data before sending it to the processor 17. Various noise filtering techniques can be used to ensure accurate processing of electromagnetic field data and corresponding accuracy in the detection of the sparks 15 and spark locations. In one embodiment, the noise filtering techniques or filter include detrending of the data, spectral analysis of the data followed by Chebyshev Filtering for Noise Reduction. In another embodiment of the invention the noise filtering technique can also include Hilbert Transform for Envelope Analysis followed by Chebyshev Filtering for Noise Reduction or signal power detection.

Figure 2:
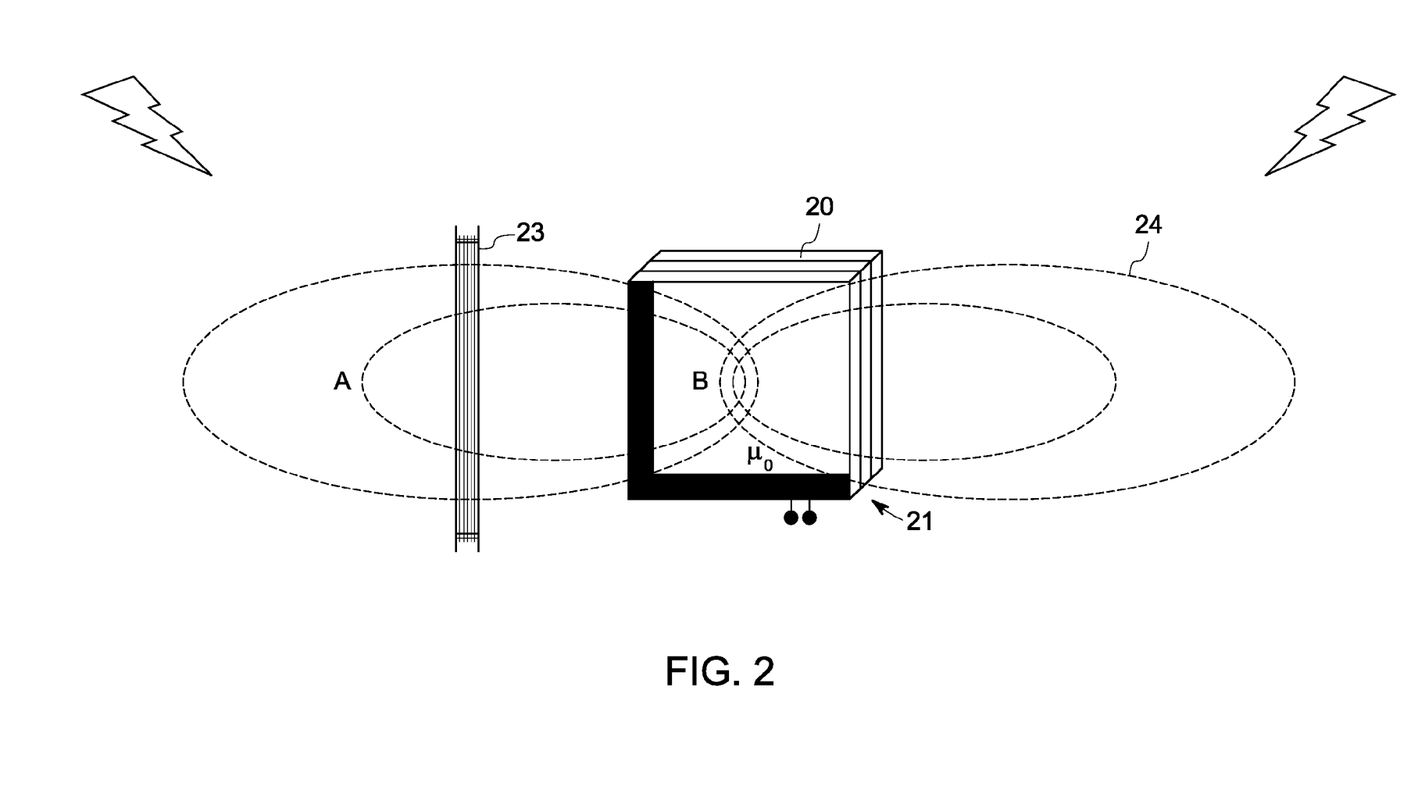
FIG. 2 illustrates a front view and a side view of an embodiment of the electromagnetic sensor in FIG. 1.

FIG. 2 illustrates a front view (21) and a side view (23) of an embodiment of the electromagnetic sensor used in FIG. 1. In the illustrated embodiment, the electromagnetic sensor is a loop antenna (20). The loop antenna typically comprises coils of wire wound on a solid or a hollow core and includes a box loop with an air core. When an electromagnetic field interacts with the loop antenna, an electromagnetic flux 24 is created that induces a voltage, which voltage, in turn, can be transduced. If V denotes the voltage induced, $H_0$ is the originated electromagnetic field intensity at the cathode, A is current, N is the number of turns, f is frequency of the electromagnetic field then the voltage induced in the coils due to the electromagnetic flux is:

$$V = 2\pi\mu_0 N A H_0 f \cos\theta$$

Figure 3:
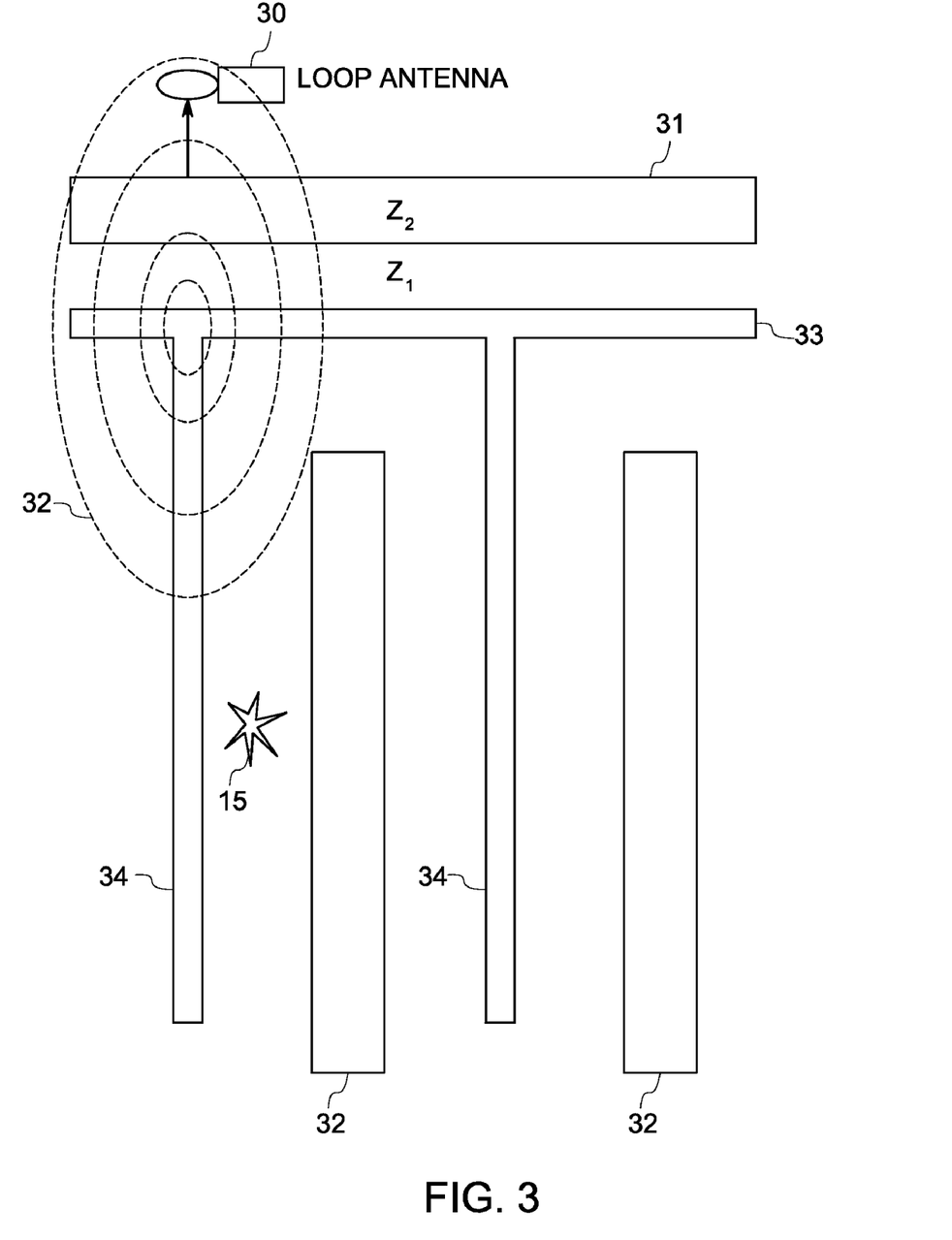
FIG. 3 illustrates another view of an electrostatic precipitator to determine loss in electromagnetic field within the electrostatic precipitator.

Referring now to FIG. 3, another view of an electrostatic precipitator is shown to illustrate loss in electromagnetic field within the electrostatic precipitator. In the illustrated embodiment, the electromagnetic sensor 30 is a loop antenna 30. An exemplary embodiment of the loop antenna is described in FIG. 2. The electrostatic precipitator includes a supply wire 33 having multiple cathodes 34 and collection plates 32 and an electromagnetic sensor 30. A spark 15, as referenced in FIG. 1, originates at one of the cathodes 34 resulting in the generation of an electromagnetic field. The electromagnetic field is incident on a barrier, for example, the cathodes, electrostatic precipitator material, or collection plates that results in reflection, transmission or absorption of a fraction of energy of the electromagnetic field. This leads to reduction in the intensity of the electromagnetic field. In addition, the temperature or humidity of a carrier medium, such as, but not limited to, air, (not shown) reduces the intensity of the electromagnetic field. Hence, the intensity of the electromagnetic field that reaches the electromagnetic sensor(s) 30 is much lower than the intensity of the electromagnetic field originated at the cathode 34. In one embodiment, the electromagnetic sensor 30 is a low frequency sensor. The extent of reduction in electromagnetic field intensity of the electromagnetic field reaching the electromagnetic sensor is explained in detail below.

If $H_t$ is the intensity of the electromagnetic field reaching the electromagnetic sensor and $H_o$ is the originating intensity of the electromagnetic field at the cathode, then $H_t$ may be expressed as:

$$H_t = \frac{4Z_1 Z_2}{(Z_1 + Z_2)^2} H_0$$

wherein $Z_1$ and $Z_2$ are electromagnetic field impedance and metal box impedance respectively. The electromagnetic field impedance $Z_1$ has a value equivalent to about 377 ohm for distant electromagnetic field and for near electromagnetic field $Z_1$ is given by $2\pi f \mu d$, wherein $d < \lambda/2\pi$. The metal box impedance $Z_2$ is given by:

$$\sqrt{\frac{\omega\mu}{\sigma}} \text{ Or } 3.68 \times 10^{-7} \sqrt{\frac{\mu_r}{\sigma_r}} \sqrt{f}$$

wherein $\mu$ is permeability and $\sigma$ is conductivity of the metal or material used. The total loss of electromagnetic field, $H_o - H_t$, is:

$$14.6 + 10\log\frac{f d^2 \sigma_r}{\mu_r} dB + 3.34 t \sqrt{f\mu_r\sigma_r} \, dB$$

wherein $\mu_r$, i.e. permeability of the metal and $\sigma_r$ is conductivity of metal depends upon the type of metal used. The electromagnetic field intensity $H_t$ that reaches the electromagnetic sensor is transduced by the electromagnetic sensor 30 at different locations of the electrostatic precipitator to generate electromagnetic profile data.

Figure 4:
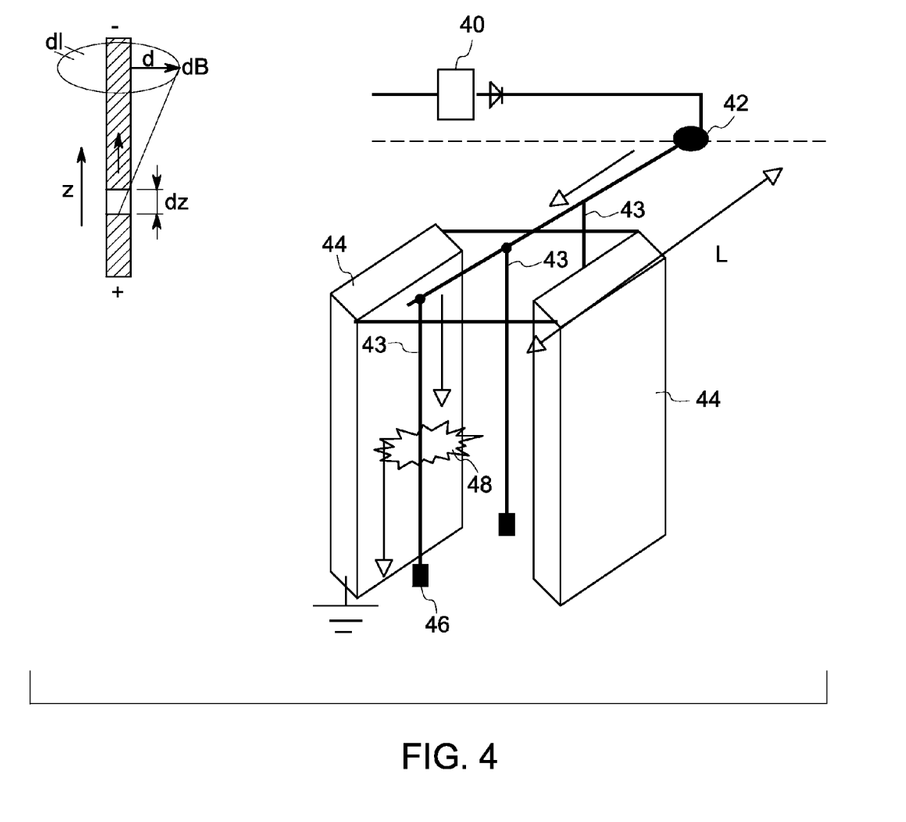
FIG. 4 illustrates another view of an electrostatic precipitator to illustrate the electromagnetic field profile calculations.

FIG. 4 illustrates another view of an electrostatic precipitator to illustrate the electromagnetic field profile calculations. The electrostatic precipitator includes a transformer 40 and a current inlet 42. The current inlet 42 is connected to the supply wire having cathodes 46 disposed therefrom. The cathodes 46 are disposed in between the collection plates 44 and a spark 48 is generated in one of the cathodes 46. Generation of spark in the electrostatic precipitator leads to flow of current. Thus, as per Ampere's law generation of current leads to generation of electromagnetic field. As shown, if L is the distance between the current inlet and spark and d is the distance between supply wire and sensor then by using the Ampere's law and Biot Savart law electromagnetic field intensity B can be determined as illustrated below.

$$\oint_L B \cdot dl = \mu_0 I \quad \text{Ampere Law}$$

$$dB = \frac{\mu_0 I}{4\pi r^2} dz \quad \text{Biot-Savart Law}$$

Combining the Ampere law and Bio-Savart law and application of the same to the electromagnetic field generated as a result of spark in the electrostatic precipitator results as follow:

$$B = \int_{-L_1}^{L_2} \frac{\mu_0 I d}{4\pi (z^2 + d^2)^{3/2}} dz$$

$$= \frac{\mu_0 I}{4\pi} \left\{ \frac{L_2}{d\sqrt{L_2^2 + d^2}} + \frac{L_2}{d\sqrt{L_1^2 + d^2}} \right\}$$

Figure 5:
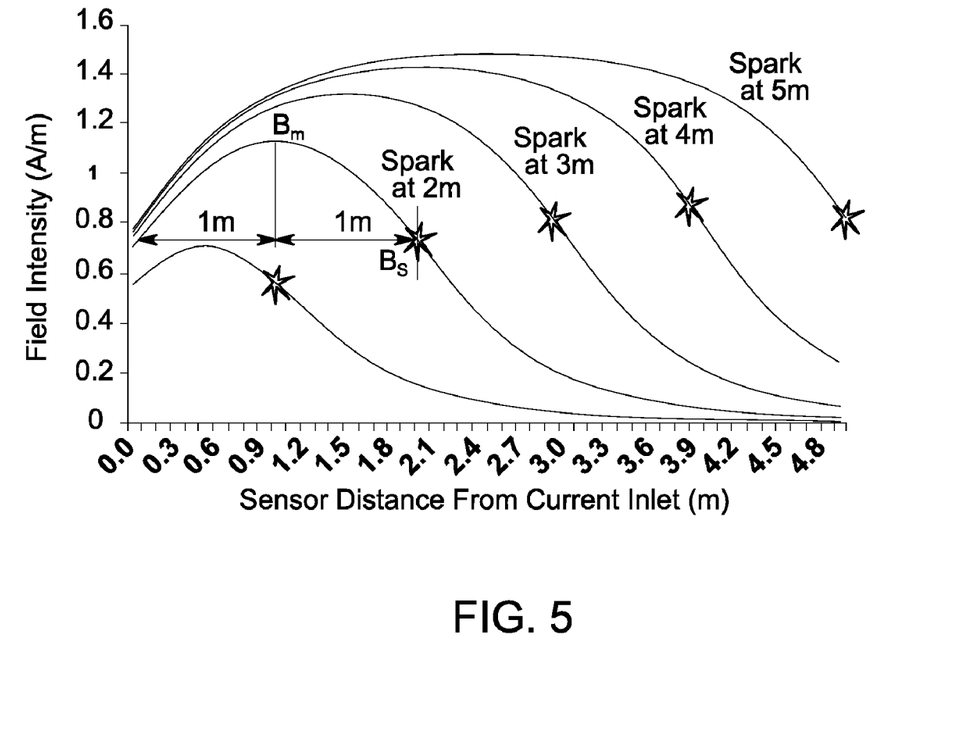
FIG. 5 illustrates a graph showing electromagnetic field profile mapped at various locations within the electrostatic precipitator.

FIG. 5 depicts a graph showing electromagnetic field profile mapped at various locations within an electrostatic precipitator. The figure shows the electromagnetic field intensity at various locations of the electrostatic precipitator mapped on the Y-axis. The sensor distances from the current inlet 42 are mapped on the X-axis. The sensor distance from a current inlet 42 is shown in meters and the electro magnetic field intensity is shown in Ampere per meters. The graph illustrates that electromagnetic field intensity is maximum at half the distance between the current inlet and a spark. Also, the electromagnetic field intensity is similar at the spark location and the current inlet location. For example, as shown in the graph when the spark is generated at a distance of 2 meters from the current inlet, the highest electro magnetic field intensity $B_m$ is at a distance of 1 meter from the current inlet whereas the electro magnetic field $B_s$ is similar at the current inlet 42 and the spark location. The ratio of peak electro magnetic field $B_m$ to the electro magnetic field generated at the spark location is:

$$4\left[1 - \frac{3d^2}{L^2 + 4d^2}\right]$$

wherein L is a distance between a current inlet and a spark and d is a distance between the spark and the current inlet.

Figure 6:
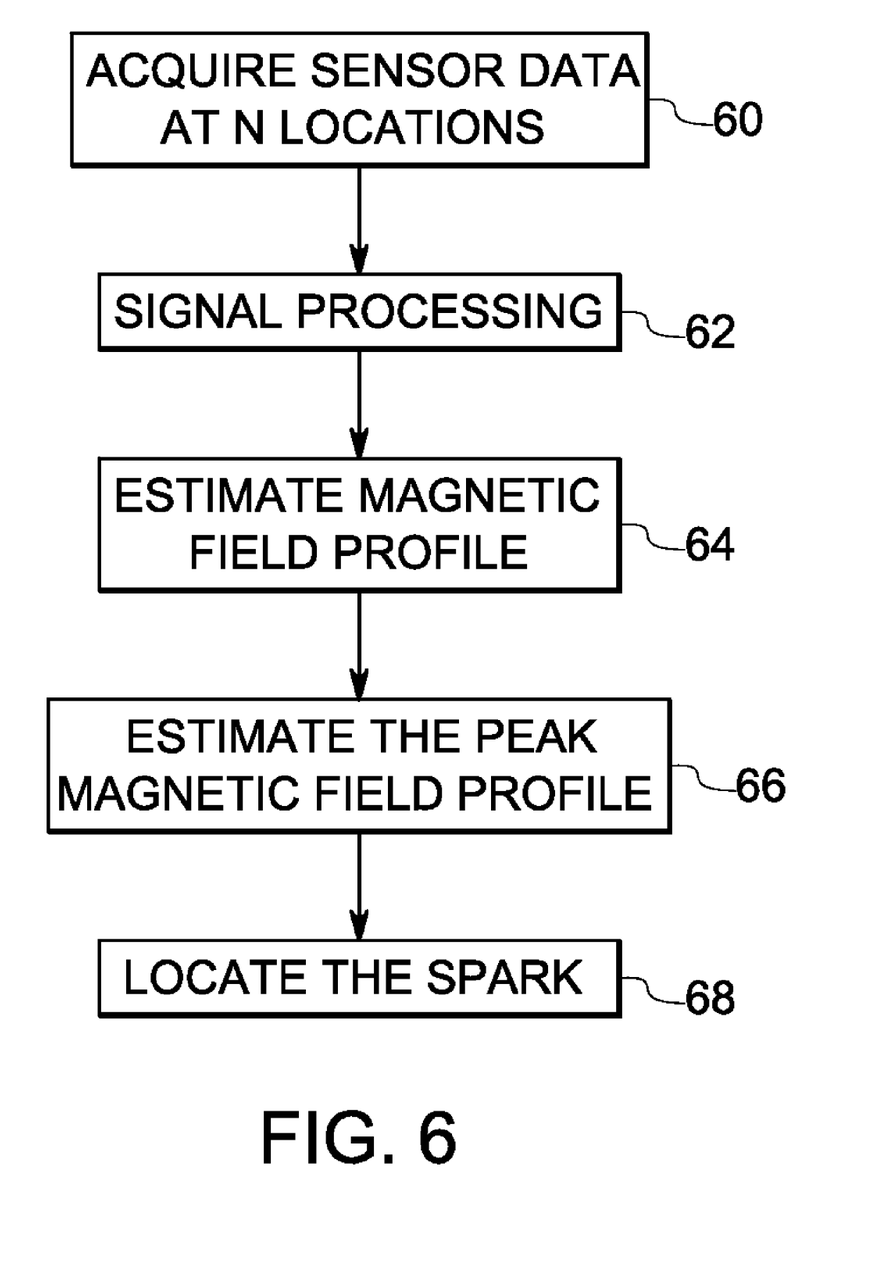
FIG. 6 illustrates a process flow diagram depicting processing of signals received by an electromagnetic sensor when sparks are generated in an ESP.

FIG. 6 illustrates a process flow diagram depicting the processing of the signals received by the processor 17 from a respective electromagnetic sensor. In step 60 the processor 17 receives electromagnetic field profile signals from the electromagnetic sensor 16. In step 62, the processor 17 processes the signals received from the electromagnetic sensor to remove noise using one or more algorithms. The processed electromagnetic field data is then further processed by the processor in step 64 to determine an electromagnetic field profile. The electromagnetic field profile includes a mapping of information including the distance of the sensor(s) 30 from a current inlet 42 mapped against the electromagnetic field intensity transduced at that distance. The electro magnetic field profile is then used to determine the peak electromagnetic field profile in step 66. The peak electromagnetic profile is a mapping of distance of the sensor(s) 30 from the current inlet 42 against the peak electromagnetic fields. The peak electromagnetic field profile is then further processed by the processor 17 in step 68 to determine the locations of the sparks 15 in the electrostatic precipitator 11.

It should be noted here that the electrostatic precipitator shown in the figures is by way of example of a typical electrostatic precipitator, and the structure or type of the same should not be constrained to the shown examples.

Figure 7:
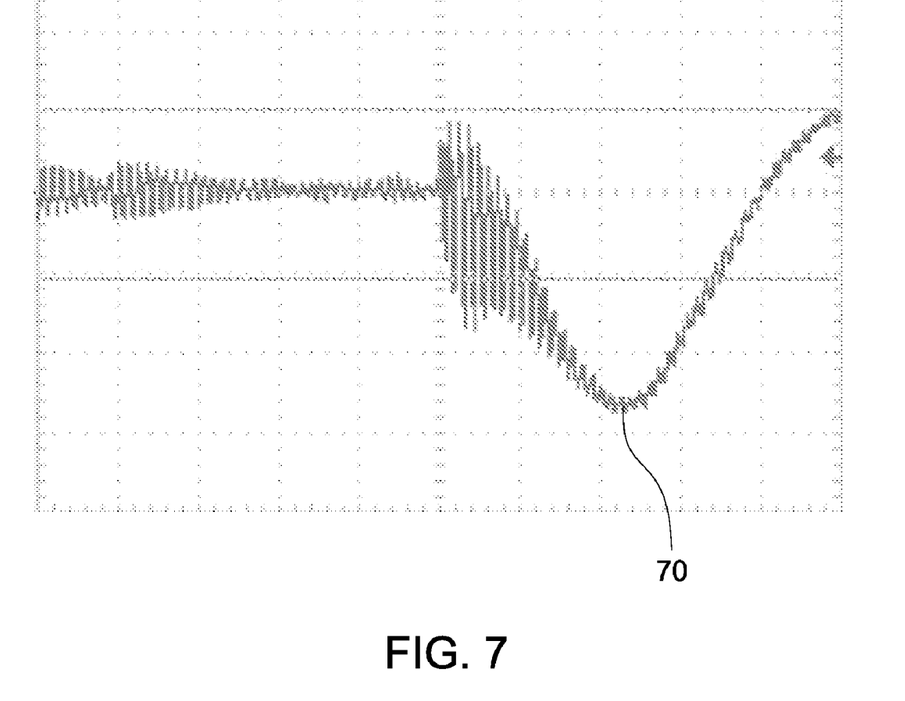
FIG. 7 graphically depicts signals received on an oscilloscope in one embodiment of the instant invention.

FIG. 7 depicts signals (indicative of electromagnetic field strength) received on an oscilloscope in an experimental set up of a representative ESP and a loop antenna (as discussed in reference to FIG. 2 above). In this experimental set up, the loop antenna is placed in a position relative to the ESP. The signals depicted in FIG. 7 indicate a spark by a spike 70, which spike 70 extends outside of a predefined area. The predefined area is determined by measuring and analyzing signals from an ESP in a baseline condition with no sparks inside the ESP. The predefined area may vary from one ESP to another ESP and is dependent on type, size or other features of an ESP. The signals are then sent to the processor 17 to determine the location of the spark in the ESP.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A system comprising:
   at least one electromagnetic sensor;
   a processing device operable to process data received from the at least one electromagnetic sensor, to estimate an electromagnetic field profile from the processed sensor data, the electromagnetic field profile comprising a mapping of information including a distance of the at least one sensor from a power source mapped against an electromagnetic field intensity transduced at the distance, and to determine a location of a spark within an electrostatic precipitator (ESP) using the estimated electromagnetic field profile.

2. The system of claim 1 wherein the at least one electromagnetic sensor comprises a portable sensor.

3. The system of claim 1 wherein the at least one electromagnet sensor comprises a plurality of electromagnetic sensors mounted over the ESP.

4. The system of claim 3 wherein the electromagnetic sensors are mounted on a roof of a building housing the ESP.

5. The system of claim 1 wherein the electromagnetic sensors are mounted adjacent to the ESP.

6. The system of claim 1 wherein the at least one electromagnetic sensor comprises a loop antenna.

7. The system of claim 1 wherein the processing device estimates a peak electromagnetic profile using the electromagnetic field profile, the peak electromagnetic profile comprising a mapping of a distance of the at least one sensor from the power source against a peak electromagnetic field.

8. The system of claim 7 wherein the processing device determines the location of the spark using the peak electromagnetic field profile.

9. The system as claimed in claim 8 wherein the peak electromagnetic field is at half the distance between the between the power source and spark.

10. A method comprising:
- obtaining electromagnetic field data from above an electrostatic precipitator (ESP) from at least one electromagnetic field sensor;
- processing the obtained electromagnetic field data to determine an electromagnetic field profile therefrom, the electromagnetic field profile comprising a mapping of information including a distance of the at least one electromagnetic field sensor from a power source mapped against an electromagnetic field intensity transduced at the distance, and
- using the electromagnetic field profile to determine a location of a spark.

11. The method of claim 10 further comprising detecting the sparks in the ESP.

12. The method of claim 10 wherein obtaining the electromagnetic field data comprises moving the at least one electromagnetic field sensor across a region above the ESP.

13. The method of claim 10 wherein obtaining the electromagnetic field data comprises moving the at least one electromagnetic field sensor adjacent the ESP.

14. The method of claim 10 wherein obtaining the electromagnetic field data comprises moving the at least one electromagnetic field sensor adjacent the ESP such that there is least electromagnetic field absorption.

15. The method of claim 10 wherein obtaining the electromagnetic field data comprises using a loop antenna.

16. The method of claim 10 wherein obtaining the electromagnetic field data comprises collecting data from a plurality of electromagnetic field sensors situated over a roof of a building housing the ESP.

17. The method of claim 10, further comprising processing the electromagnetic field profile to determine a peak electromagnetic field profile, the peak electromagnetic profile comprising a mapping of a distance of the at least one sensor from the power source against a peak electromagnetic field.

18. The method of claim 17 wherein determining the location of the spark comprises using the peak electromagnetic field profile.

19. The method of claim 17 wherein the peak electromagnetic field is at half the distance between the current power source and the spark.

* * * * *